(12) United States Patent
Sugimoto et al.

(10) Patent No.: US 9,865,723 B2
(45) Date of Patent: Jan. 9, 2018

(54) SWITCHING DEVICE

(71) Applicant: Toyota Jidosha Kabushiki Kaisha, Toyota-shi, Aichi-ken (JP)

(72) Inventors: Masahiro Sugimoto, Toyota (JP); Yukihiko Watanabe, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/403,445

(22) Filed: Jan. 11, 2017

(65) Prior Publication Data

US 2017/0200819 A1 Jul. 13, 2017

(30) Foreign Application Priority Data

Jan. 12, 2016 (JP) .................................. 2016-003793

(51) Int. Cl.
*H01L 29/66* (2006.01)
*H01L 29/778* (2006.01)
(Continued)

(52) U.S. Cl.
CPC ........ *H01L 29/7787* (2013.01); *H01L 23/535* (2013.01); *H01L 29/2003* (2013.01);
(Continued)

(58) Field of Classification Search
CPC ........... H01L 29/0673; H01L 29/66795; H01L 29/785; H01L 29/42392; H01L 21/76224; H01L 29/7813; H01L 29/7827; H01L 27/088; H01L 29/41741; H01L 29/66666; H01L 29/084; H01L 29/402;
(Continued)

(56) References Cited

U.S. PATENT DOCUMENTS

| 8,445,939 B2 * | 5/2013 | Grant ................ H01L 21/28114 |
| | | 257/192 |
| 2009/0140330 A1 | 6/2009 | Yagi et al. |

(Continued)

FOREIGN PATENT DOCUMENTS

| JP | H07118539 B2 | 12/1995 |
| JP | 2911146 B2 | 6/1999 |

(Continued)

*Primary Examiner* — Vu A Vu
(74) *Attorney, Agent, or Firm* — Dinsmore & Shohl LLP

(57) ABSTRACT

A switching device includes first-third semiconductor layers, a gate insulating film, and a gate electrode. The first semiconductor layer is of a first conductivity type. The second semiconductor layer is of a second conductivity type and in contact with the first semiconductor layer. The third semiconductor layer is of the first conductivity type, in contact with the second semiconductor layer. The gate insulating film covers a surface of the second semiconductor layer in a range in which the second semiconductor layer separates the first semiconductor layer from the third semiconductor layer. The gate electrode faces the second semiconductor layer via the gate insulating film. The gate electrode includes a fourth semiconductor layer covering a surface of the gate insulating film; and a fifth semiconductor layer having a bandgap different from a bandgap of the fourth semiconductor layer and covering a surface of the fourth semiconductor layer.

3 Claims, 8 Drawing Sheets

(51) Int. Cl.
*H01L 29/20* (2006.01)
*H01L 23/535* (2006.01)
*H01L 29/08* (2006.01)
*H01L 29/78* (2006.01)
*H01L 27/108* (2006.01)
*H01L 29/739* (2006.01)
*H01L 27/088* (2006.01)
*H01L 29/417* (2006.01)
*H01L 29/40* (2006.01)

(52) U.S. Cl.
CPC ...... *H01L 27/088* (2013.01); *H01L 27/10823* (2013.01); *H01L 27/10876* (2013.01); *H01L 29/0847* (2013.01); *H01L 29/402* (2013.01); *H01L 29/41741* (2013.01); *H01L 29/66666* (2013.01); *H01L 29/66712* (2013.01); *H01L 29/7395* (2013.01); *H01L 29/7802* (2013.01); *H01L 29/7813* (2013.01); *H01L 29/7827* (2013.01)

(58) Field of Classification Search
CPC ............. H01L 29/7802; H01L 29/1608; H01L 27/10823; H01L 27/10876; H01L 29/66484; H01L 29/66712; H01L 29/7395
USPC ...................................................... 257/139
See application file for complete search history.

(56) References Cited

U.S. PATENT DOCUMENTS

2011/0017998 A1    1/2011   Nakano et al.
2015/0076592 A1*   3/2015   Asahara ............. H01L 29/4236
                                                          257/330

FOREIGN PATENT DOCUMENTS

| JP | 2000150875 A | 5/2000 |
|----|--------------|--------|
| JP | 2009141005 A | 6/2009 |
| JP | 2011100967 A | 5/2011 |
| JP | 2013-123074 A | 6/2013 |
| JP | 2015-126080 A | 7/2015 |

* cited by examiner

SWITCHING DEVICE

CROSS-REFERENCE TO RELATED APPLICATION

This application claims priority to Japanese Patent Application No. 2016-003793 filed on Jan. 12, 2016, the entire contents of which are hereby incorporated by reference into the present application.

TECHNICAL FIELD

The technique disclosed herein relates to a switching device.

Japanese Patent Application Publication No. 2015-126080 discloses a MOSFET (Metal-Oxide-Semiconductor Field-Effect Transistor). A gate electrode of this MOSFET is constituted of polysilicon.

SUMMARY

A switching speed of a MOSFET is adjusted by a resistance connected to a gate electrode (hereinbelow referred to as a gate resistance). The switching speed of the MOSFET is faster with a smaller gate resistance. On the other hand, the gate electrode constituted of polysilicon itself has a resistance. Thus, even if the gate resistance is set to substantially zero, the switching speed of the MOSFET is limited by the gate electrode's own resistance. In order to allow the MOSFET to switch at a faster speed, the gate electrode's own resistance needs to be reduced. Notably, this problem occurs not only in MOSFETs hut also in other switching devices having gate electrodes (for example, IGBTs (Insulated Gate Bipolar Transistors)). Thus, the present disclosure provides a technique that reduces a resistance of a gate electrode of a switching device.

A switching device disclosed herein comprises first-third semiconductor layers, a gate insulating film, and a gate electrode. The first semiconductor layer is of a first conductivity type. The second semiconductor layer is of a second conductivity type and in contact with the first semiconductor layer. The third semiconductor layer is of the first conductivity type, in contact with the second semiconductor layer, and separated from the first semiconductor layer by the second semiconductor layer. The gate insulating film covers a surface of the second semiconductor layer in a range in which the second semiconductor layer separates the first semiconductor layer from the third semiconductor layer. The gate electrode faces the second semiconductor layer via the gate insulating film. The gate electrode comprises a fourth semiconductor layer covering a surface of the gate insulating film; and a fifth semiconductor layer having a bandgap different from a bandgap of the fourth semiconductor layer and covering a surface of the fourth semiconductor layer.

In this switching device, the gate electrode comprises a layered structure of the fourth semiconductor layer and the fifth semiconductor layer. Since the bandgaps of the fourth semiconductor layer and the fifth semiconductor layer differ, an interface thereof is a heterojunction. Two-dimensional gas of carriers (electrons or holes) is generated at the heterojunction. The two-dimensional gas of carriers is constituted of high-density carriers distributed two-dimensionally. For example, in a case where the carriers are electrons, two-dimensional electron gas (hereinbelow referred to as 2DEG (2-Dimensional Electron Gas)) is generated. Further, in a case where the carriers are holes, two-dimensional hole gas (hereinbelow referred to as 2DHG (2-Dimensional Hole Gas)) is generated. Since a carrier density is extremely high in the two-dimensional gas of carriers, an electric resistance of the two-dimensional gas of carriers is extremely low. Thus, according to this configuration, an electric resistance of the gate electrode can be reduced. Due to this, the switching device can switch at a fast speed.

DETAILED DESCRIPTION

First Embodiment

Figure 1:
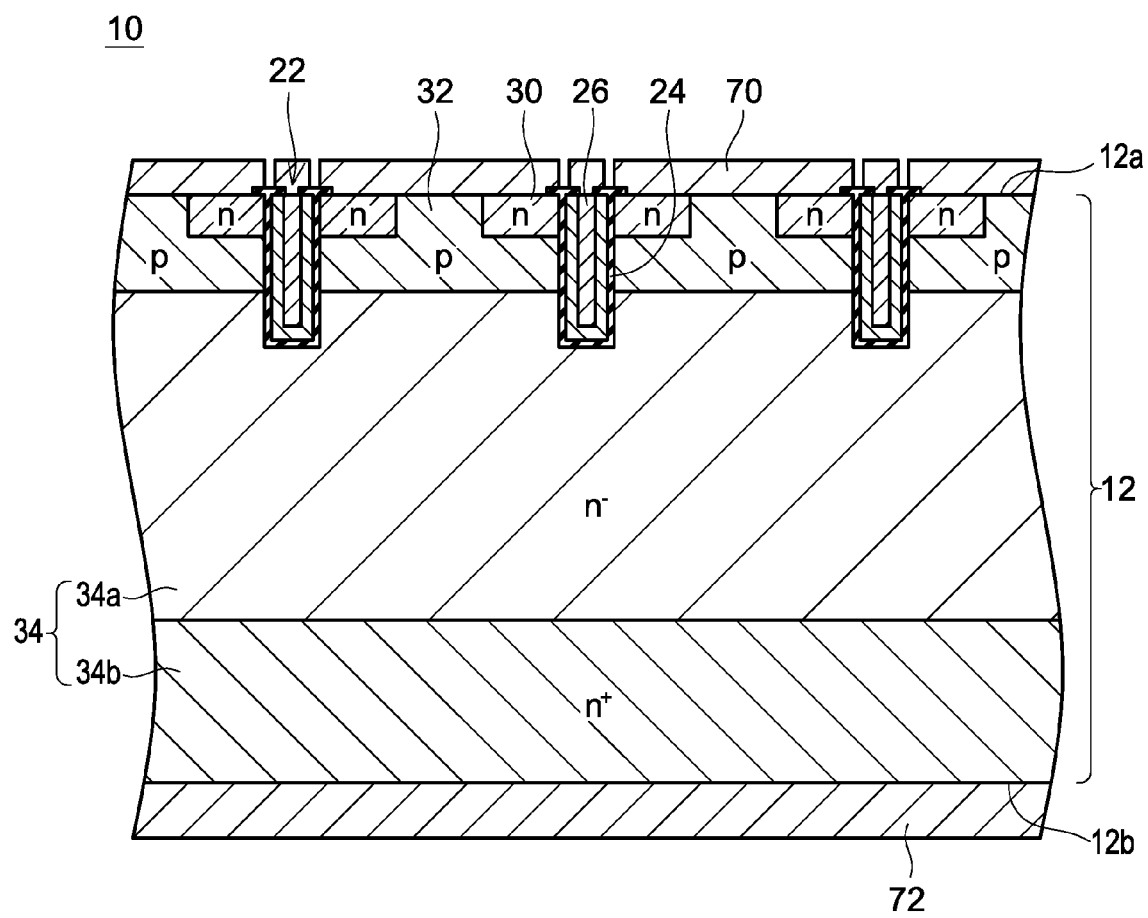
FIG. 1 is a vertical cross sectional view of a MOSFET 10 of a first embodiment.

As shown in FIG. 1, a MOSFET 10 of a first embodiment comprises a semiconductor substrate 12. The semiconductor substrate 12 is constituted of silicon, SiC, or the like.

An upper surface 12a of the semiconductor substrate 12 is provided with a plurality of trenches 22. Each trench 22 extends linearly along a direction vertical to a sheet surface of FIG. 1. The plurality of trenches 22 is arranged with intervals between them along a left-and-right direction of FIG. 1.

Figure 2:
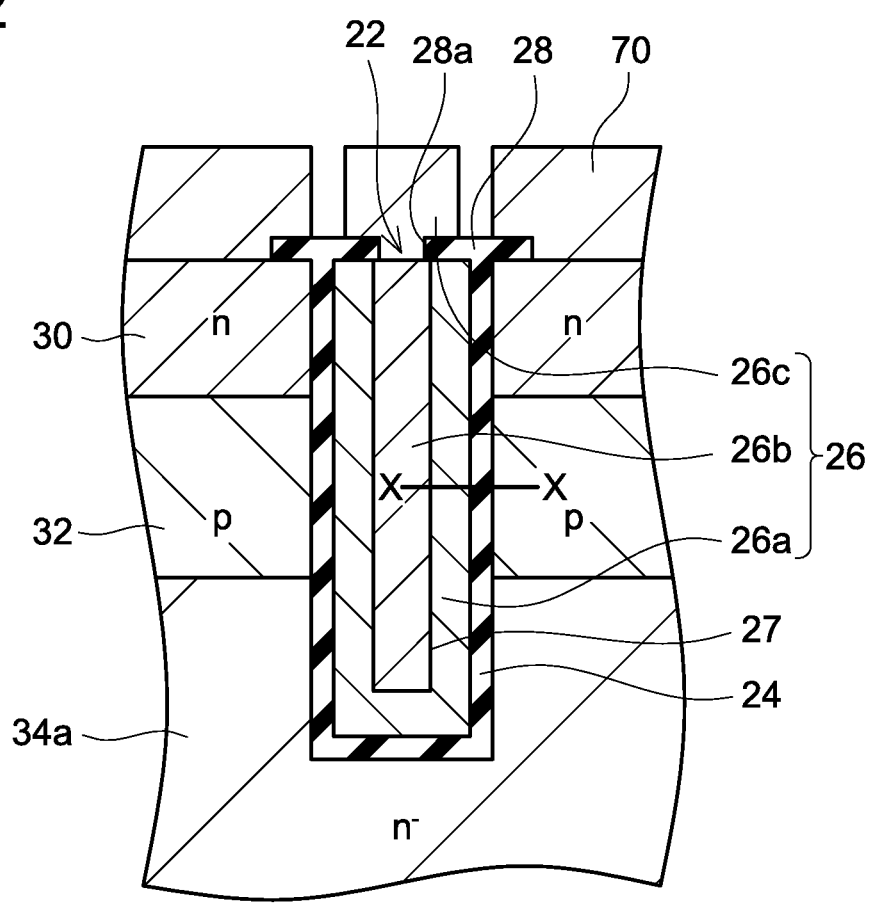
FIG. 2 is an enlarged cross sectional view of a gate electrode 26 of the MOSFET 10 of the first embodiment.

As shown in FIG. 2, an inner surface of each trench 22 is covered by a gate insulating film 24. A gate electrode 26 is arranged inside each trench 22. A part of each gate electrode 26 protrudes upward from the corresponding trench 22. Each gate electrode 26 is insulated from the semiconductor substrate 12 by its corresponding gate insulating film 24. Each gate electrode 26 comprises a semiconductor layer 26a, a semiconductor layer 26b, and a wiring layer 26c.

The semiconductor layers 26a are each constituted of i-type AlGaN. The semiconductor layers 26a cover surfaces of their corresponding gate insulating films 24.

The semiconductor layers 26b are each constituted of n-type GaN. Each semiconductor layer 26b is arranged at a center portion of the corresponding trench 22 in a width direction, and covers a surface of the corresponding semiconductor layer 26a. That is, the gate insulating film 24, the semiconductor layer 26a, and the semiconductor layer 26b are layered in this order along a direction vertical to the inner surface of each trench 22. Each semiconductor layer 26b is separated from the corresponding gate insulating film 24 by the corresponding semiconductor layer 26a. A bandgap of the semiconductor layers 26b (that is, GaN) is narrower than a bandgap of the semiconductor layers 26a (that is, AlGaN). Thus, a heterojunction 27 is provided at an interface of each pair of the semiconductor layers 26b and the semiconductor layers 26a. The heterojunctions 27 extend along the inner surfaces of the respective trenches 22.

Interlayer insulating films 28 are arranged above the trenches 22. Each interlayer insulating film 28 covers an entire region of an upper end surface of its corresponding semiconductor layer 26a. An opening 28a is provided in each interlayer insulating film 23 above the corresponding semiconductor layer 26b. Thus, most parts of upper end surfaces of the semiconductor layers 26b are not covered by the interlayer insulating films 28.

The wiring layers 26c are constituted of metal. Each wiring layer 26c is arranged inside its corresponding opening 28a and on its corresponding interlayer insulating film 28. The wiring layers 26c are in contact respectively with the semiconductor layers 26b within the openings 28a. The wiring layers 26c are separated respectively from the semiconductor layers 26a by the interlayer insulating films 28. The wiring layer 26c of each gate electrode 26 is connected to a gate wiring at a position that is not shown. The gate wirings are connected to gate bonding pads that are not shown. A potential of each gate electrode 26 is controlled by a potential applied to the corresponding gate bonding pad.

As shown in FIG. 1, an upper electrode 70 is arranged on the upper surface 12a of the semiconductor substrate 12. The upper electrode 70 is arranged at portions where no trench 22 is provided. The upper electrode 70 is in contact with the upper surface 12a of the semiconductor substrate 12 at the portions where no trench 22 is provided.

A lower electrode 72 is provided on a lower surface 12b of the semiconductor substrate 12. The lower electrode 72 is in contact with the lower surface 12b of the semiconductor substrate 12.

A plurality of source regions 30, a body region 32, and a drain region 34 are provided inside the semiconductor substrate 12.

Each source region 30 is an n-type region. Each source region 30 is arranged at a position exposed on the upper surface 12a of the semiconductor substrate 12, and makes ohmic contact with the upper electrode 70. Further, each source region 30 is in contact with the corresponding gate insulating film 24 at an upper end portion of the corresponding trench 22.

The body region 32 is a p-type region. The body region 32 is in contact with the respective source regions 30. The body region 32 extends from ranges intervened between two source regions 30 to undersides of all the source regions. A p-type impurity density in the body region 32 is high in the ranges intervened between two source regions 30. The body region 32 makes ohmic contact with the upper electrode 70 in the ranges intervened between two source regions 30. The p-type impurity density in the body region 32 is low under the source regions 30. The body region 32 is in contact with the gate insulating films 24 under the respective source regions 30. A lower end of the body region 32 is positioned above lower ends of the gate electrodes 26.

The drain region 34 is an n-type region. The drain region 34 is arranged under the body region 32, and is separated from the source regions 30 by the body region 32. The drain region 34 comprises a drift region 34a having a low n-type impurity density, and a drain contact region 34b having a higher n-type impurity density than the drift region 34a. The drift region 34a is arranged under the body region 32. The drift region 34a is in contact with the gate insulating films 24 under the body region 32. The drain contact region 34b is arranged under the drift region 34a. The drain contact region 34b is exposed on the lower surface 12b of the semiconductor substrate 12. The drain contact region 34b makes ohmic contact with the lower electrode 72.

A basic configuration of the MOSFET 10 is made by the aforementioned source regions 30, body region 32, drain region 34, gate electrodes 26, gate insulating films 24, and the like. The upper electrode 70 functions as a source electrode of the MOSFET 10. The lower electrode 72 functions as a drain electrode of the MOSFET 10.

Figure 3:
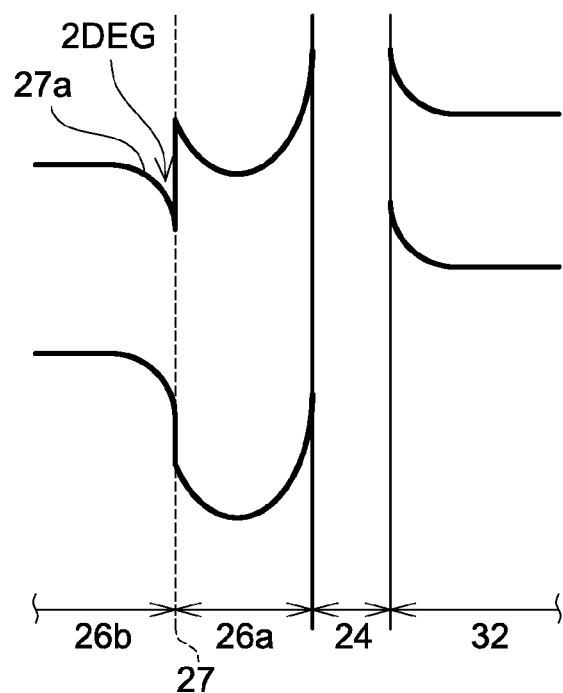
FIG. 3 is a diagram of a band at a position along a line X-X in FIG. 2 when a gate-off potential is applied.

FIG. 3 shows a diagram of a band at a position along a line X-X in FIG. 2. FIG. 3 is a diagram of the band when a gate-off potential is applied to the gate electrodes 26. As aforementioned, the bandgap of the semiconductor layers 26a (AlGaN) is wider than the bandgap of the semiconductor layers 26b (GaN). Thus, the heterojunctions 27 are generated at the interfaces of the semiconductor layers 26a and the semiconductor layers 26b. Further, since the semiconductor layers 26b are of the n-type and the semiconductor layers 26a are of the i-type, a band of the semiconductor layer 26b is curved downward in a vicinity of the heterojunction 27. As a result, a dent 27a is generated in a conduction band at the heterojunction 27, and the dent 27a is filled with a large number of electrons. Due to this, a 2DEG is generated at the heterojunction 27. An electron density of the 2DEG generated in the vicinity of the heterojunction 27 is extremely high while an impurity density in the vicinity of the heterojunction 27 is low, so the 2DEG has an extremely low resistance. Accordingly, each gate electrode 26 comprises the 2DEG (that is, the heterojunction 27) with an extremely low electric resistance.

Next, an operation of the MOSFET 10 will be described. Upon using the MOSFET 10, a potential higher than that for the upper electrode 70 is applied to the lower electrode 72. Further, as aforementioned, the potential of the respective gate electrodes 26 is controlled by the gate bonding pads. The potential of the gate bonding pads is controlled between a gate-on potential and a gate-off potential. The gate-on potential is a potential higher than a gate threshold of the MOSFET 10, and the gate-off potential is a potential lower than the gate threshold of the MOSFET 10.

When the potential of the gate bonding pads is increased from the gate-off potential to the gate-on potential, electric charges flow from the gate bonding pads to the respective gate electrodes 26. The electric charges supplied to the gate electrodes 26 flow into the 2DEGs generated in the heterojunctions 27 from the wiring layers 26c through the semiconductor layers 26b. Notably, the electric charges being supplied to the 2DEGs is equivalent to electrons being drawn out from the 2DEGs. When the electric charges that had flown into each 2DEG are dispersed over an entirety of the 2DEG, the potential of the entire gate electrode 26 rises from the gate-off potential to the gate-on potential. When the potential of the gate electrodes 26 rises to the gate-on potential, channels are generated in the body region 32 in ranges that are adjacent to the respective gate insulating films 24. Thus, a current flows from the lower electrode 72 to the upper electrode 70 through the drain region 34, the channels, and the source regions 30. That is, the MOSFET 10 turns on.

When the potential of the gate bonding pads is lowered from the gate-on potential to the gate-off potential, the electric charges flow from the respective gate electrodes 26 to the gate bonding pads. That is, the electric charges that were dispersed over the entireties of the 2DEGs are discharged outside through the wiring layers 26c. When this happens, the potential of the entire gate electrodes 26 drops from the gate-on potential to the gate-off potential. When the potential of the gate electrodes 26 drops to the gate-off potential, the channels disappear from within the body region 32. Accordingly, the current that was flowing in the MOSFET 10 stops. That is, the MOSFET 10 turns off.

In a conventional MOSFET, it takes time for electric charges supplied to gate electrodes to disperse within the gate electrodes upon when the MOSFET turns on, due to a resistance of the gate electrodes being high. Due to this, a potential increasing speed in the gate electrodes is slow, and thus a turn-on speed of the MOSFET is slow. Contrary to this, in the MOSFET 10 of the first embodiment, the resistance of the 2DEGs generated in the gate electrodes 26 is extremely low. Due to this, when the MOSFET 10 turns on, the electric charges supplied to the gate electrodes 26 disperse over the entireties of the 2DEGs in a short period of time. Thus, a potential increasing speed of the gate electrodes 26 is fast, and thus a turn-on speed of the MOSFET 10 of the first embodiment is fast.

Further, in the conventional MOSFET, due to the resistance of the gate electrodes being high, it takes time for the electric charges in the gate electrodes to flow to outside of the gate electrodes when the MOSFET turns off. Due to this, a potential dropping speed of the gate electrodes is slow, and thus a turn-off speed of the MOSFET is slow. Contrary to this, in the MOSFET 10 of the first embodiment, the resistance of the 2DEGs generated in the gate electrodes 26 is extremely low. Due to this, when the MOSFET 10 turns off, the electric charges that were dispersed within the 2DEGs flow to outside of the gate electrodes 26 in a short period of time. Thus, a potential dropping speed of the gate electrodes 26 is fast, and a turn-off speed of the MOSFET 10 of the first embodiment is fast.

As explained above, the MOSFET 10 of the first embodiment has a low resistance in the 2DEGs (that is, the gate electrodes 26), and thus its switching speed is fast.

Further, in the recent years, a thickness of gate electrodes is becoming thinner accompanying downscaling of MOSFETs. The conventional gate electrodes constituted of polysilicon tend to have a higher resistance with thinner thickness. Contrary to this, in the MOSFET 10 of the first embodiment, a low resistance in the gate electrodes 26 can be facilitated by the 2DEGs having an extremely thin thickness. Thus, the resistances of the gate electrodes 26 can be made low even with the gate electrodes 26 with thin thicknesses.

Further, in the MOSFET 10 of the first embodiment, the semiconductor layers 26a are depleted during when the gate-off potential is applied. Thus, a potential difference between the 2DEGs and the drift region 34a can be endured not only by the gate insulating films 24 but also by the semiconductor layers 26a. Due to this, an electric field generated in a vicinity of the lower end of each trench 22 can be moderated. Thus, the MOSFET 10 of the first embodiment has a high voltage resistance.

Figure 4:
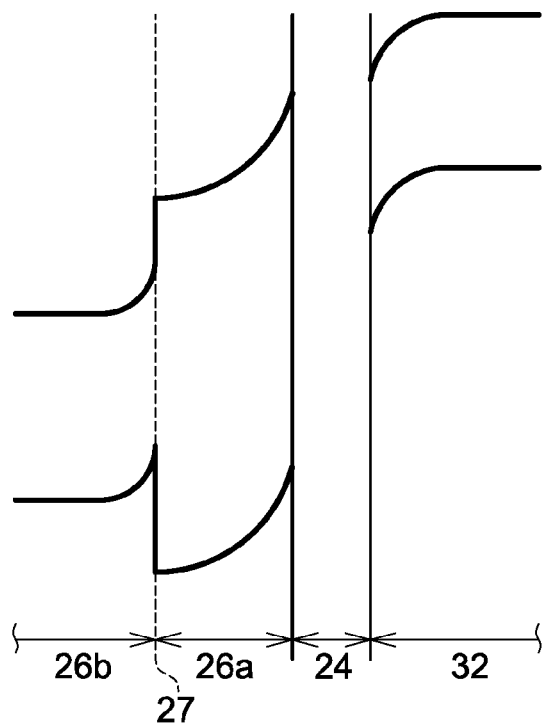
FIG. 4 is a diagram of the band at the position along the line X-X in FIG. 2 when a gate-on potential is applied.

Notably, FIG. 4 is a diagram of a band at a position corresponding to FIG. 3, and shows the diagram of the band when a potential higher than the gate-on potential is applied to the gate electrodes 26. Since such a high potential is applied to the gate electrodes 26, as compared to FIG. 3, the bands of the semiconductor layers 26a, 26b are shifted downward relative to the band of the body region 32. Further, in the first embodiment, the wiring layers 26c are connected to the semiconductor layers 26b and yet separated from the semiconductor layers 26a. Thus, the potential is applied directly to the semiconductor layers 26b from the wiring layers 26c, however, the potential is applied to the semiconductor layers 26a from the wiring layers 26c via the semiconductor layers 26b. Due to this, in a state of FIG. 4, the potential of the semiconductor layers 26b is higher than the potential of the semiconductor layers 26a. Thus, as compared to FIG. 3, the band of the semiconductor layers 26b is shifted downward relative to the band of the semiconductor layers 26a in FIG. 4. As above, since the band of the semiconductor layers 26b is shifted downward relative to the band of the semiconductor layers 26a, the dents 27a (see FIG. 3) that were generated in the heterojunctions 27 disappeared in FIG. 4. That is, in FIG. 4, the 2DEGs disappeared. Accordingly, in the MOSFET 10 of the first embodiment, when the potential of the gate electrodes 26 is increased to a predetermined value, the 2DEGs disappear. Due to this, it becomes difficult to reduce the gate electrode resistance by increasing the potential of the gate electrodes 26 to higher levels. The MOSFET 10 of the first embodiment needs to be used within a potential range in which the 2DEGs will not disappear.

Second Embodiment

Figure 5:
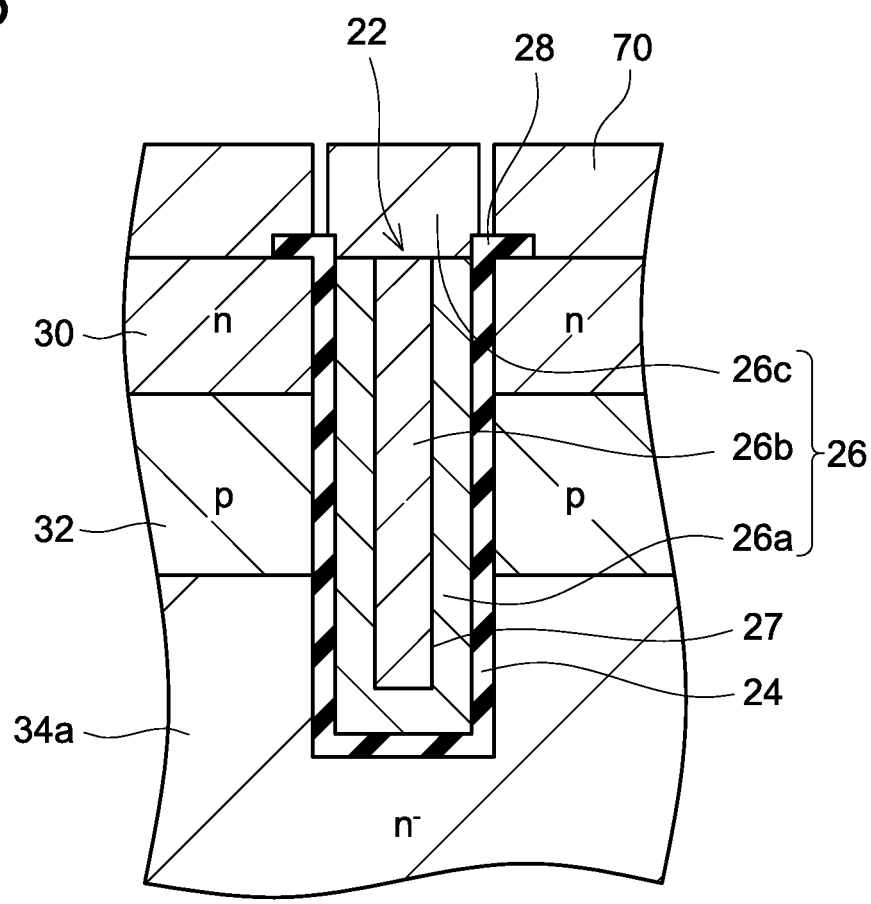
FIG. 5 is an enlarged cross sectional view of a gate electrode 26 of a MOSFET of a second embodiment.

FIG. 5 shows a MOSFET of a second embodiment. In the MOSFET of the second embodiment, no interlayer insulating film 28 is arranged at the upper end surfaces of the semiconductor layers 26a. Thus, the respective wiring layers 26c make contact with both the semiconductor layers 26a and the semiconductor layers 26b. Other configurations of the MOSFET of the second embodiment are similar to those of the MOSFET 10 of the first embodiment.

Figure 6:
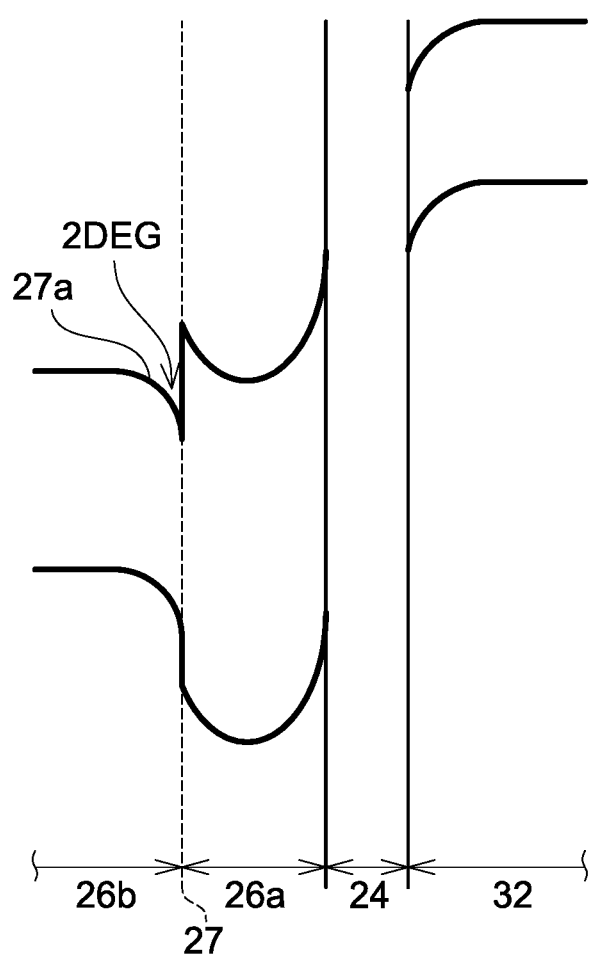
FIG. 6 is a diagram of a band at a position corresponding to the line X-X in the MOSFET of the second embodiment when a gate-on potential is applied.

In the MOSFET of the second embodiment, since each wiring layer 26c is in contact with both the semiconductor layer 26a and the semiconductor layer 26b, the semiconductor layer 26a and the semiconductor layer 26b come to be at a same potential. In the MOSFET of the second embodiment as well, its diagram of the band when the gate-off potential is applied is identical to that of FIG. 3. On the other hand, in the MOSFET of the second embodiment, no potential difference is generated between the semiconductor layer 26a and the semiconductor layer 26b even when the potential of the gate electrode 26 is increased. Due to this, even if the potential of the gate electrode 26 is raised to the same degree as FIG. 4, the dents 27a do not disappear as shown in FIG. 6. That is, in the MOSFET of the second embodiment, the 2DEGs do not disappear even if the potential of the gate electrodes 26 is raised to a high potential. Thus, the MOSFET of the second embodiment has a broader range of usable gate potential. Due to this, the threshold in the MOSFET of the second embodiment can be designed to a higher value than in the first embodiment.

Third Embodiment

A MOSFET of a third embodiment has the semiconductor layers 26b constituted of the p-type GaN. Other configurations of the MOSFET of the third embodiment are similar to those of the MOSFET 10 of the first embodiment.

Figure 7:
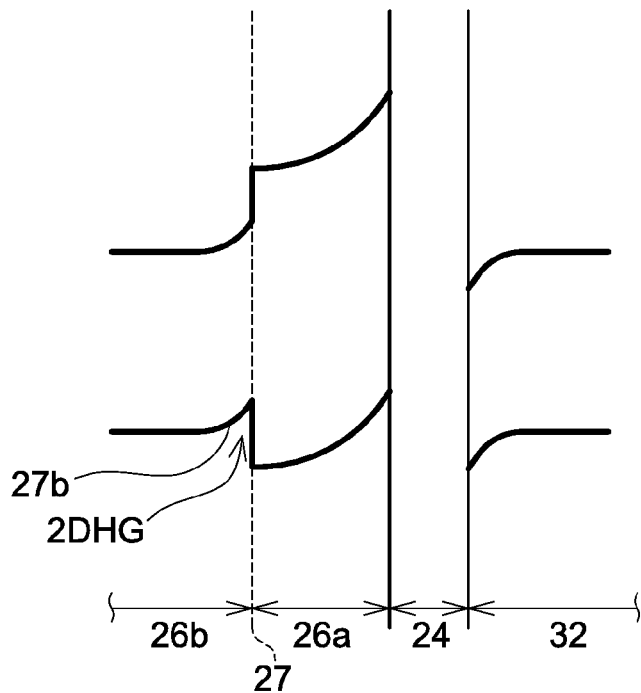
FIG. 7 is a diagram of a band at a position corresponding to the line X-X in a MOSFET of a third embodiment when a gate-off potential is applied.

FIG. 7 shows a diagram of a band of the MOSFET of the third embodiment. FIG. 7 is the diagram of the band when the gate-off potential is applied. In the MOSFET of the third embodiment, since the semiconductor layers 26b are of the p-type, the band of the semiconductor layers 26b curves upward in the vicinities of the heterojunctions 27. Due to this, dents 27b are generated in a valence band at the heterojunctions 27. The dents 27b are filled with a large number of holes. Due to this, 2DHGs are generated at the heterojunctions 27. The 2DHGs have a low resistance. Thus, the switching speed of the MOSFET of the third embodiment is fast.

Figure 8:
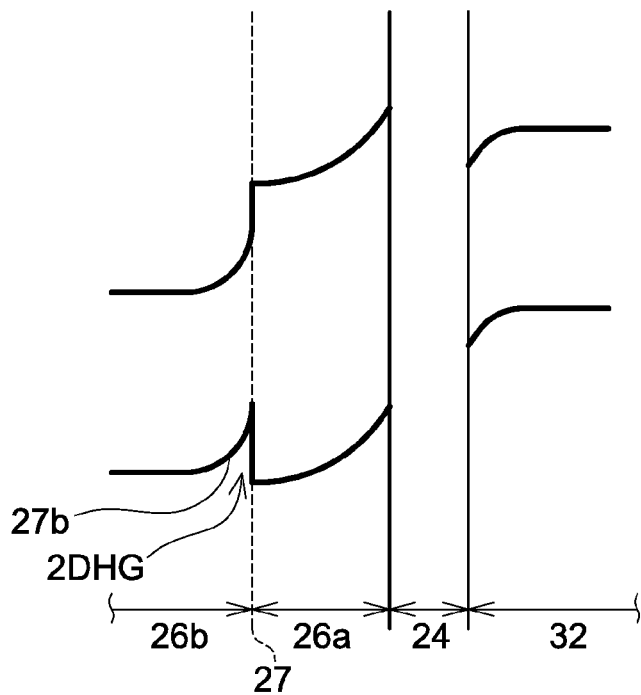
FIG. 8 is a diagram of the band at the position corresponding to the line X-X in the MOSFET of the third embodiment when a gate-on potential is applied.

Further, in the MOSFET of the third embodiment, similar to the first embodiment, the semiconductor layers 26a are separated from the wiring layers 26c by the interlayer insulating films 28. Thus, when the potential of the gate electrodes 26 (that is, the wiring layers 26c) is raised, the potential of the semiconductor layers 26b becomes higher than the potential of the semiconductor layers 26a. Due to this, as shown in FIG. 8, the band of the semiconductor layers 26b shifts downward relative to the band of the semiconductor layers 26a. In this configuration, the dents 27b become deeper, and a hole density of the 2DHGs becomes higher. Thus, in the MOSFET of the third embodiment, the 2DHGs do not disappear even if the potential of the gate electrodes 26 is increased. Thus, the MOSFET of the third embodiment has a broad range of usable gate potential. Due to this, the threshold in the MOSFET of the third embodiment can be designed to a higher value than in the first embodiment.

Fourth Embodiment

Figure 9:
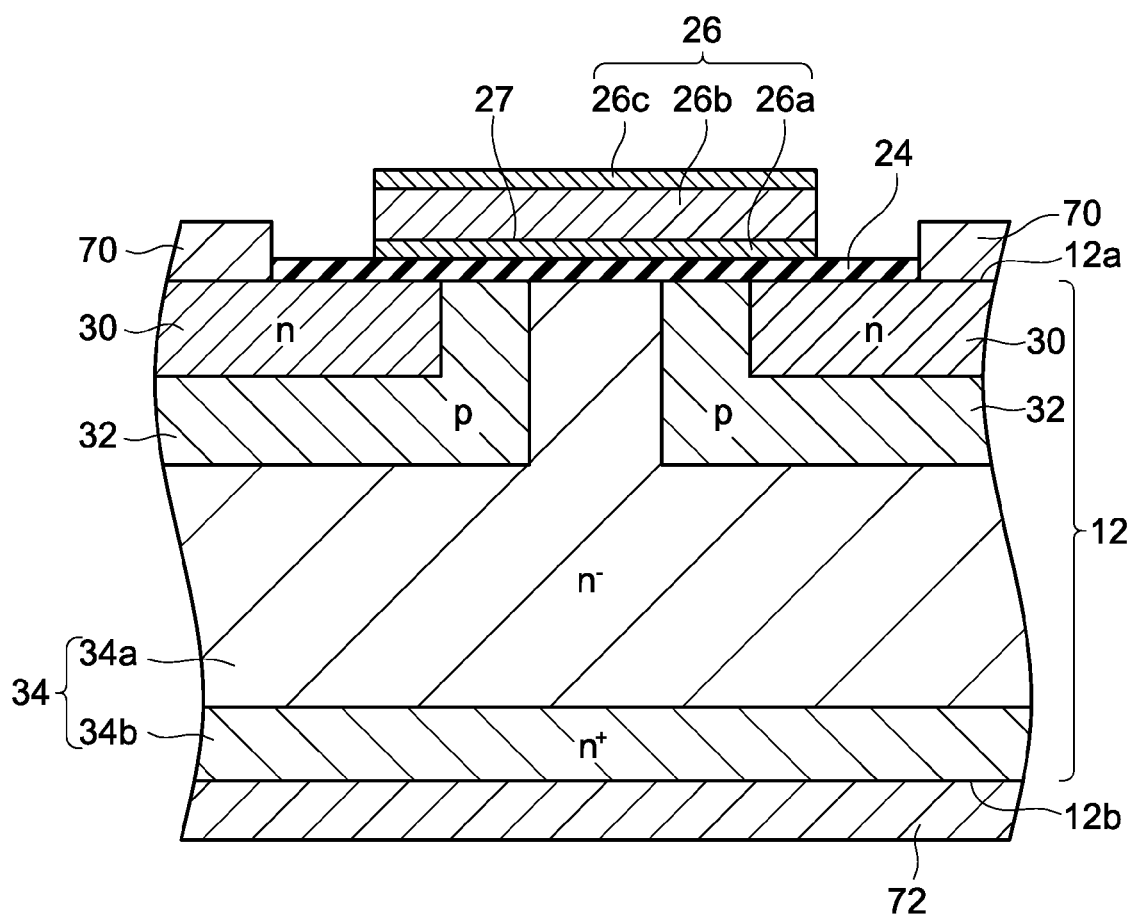
FIG. 9 is a vertical cross sectional view of a MOSFET of a fourth embodiment.

FIG. 9 shows a MOSFET of a fourth embodiment. Notably, in FIG. 9, same reference signs as those of FIGS. 1 and 2 are given to portions having same functions as the MOSFET of the first embodiment. In the first embodiment, the gate electrodes 26 were of a trench type, however, in the fourth embodiment, the gate electrodes 26 are of a planar type. That is, in the MOSFET of the fourth embodiment, the source regions 30, the body region 32, and the drift region 34a are arranged to be exposed on the upper surface 12a. The upper surface 12a in ranges where the body region 32 is exposed is covered by the gate insulating films 24. The gate electrode 26 (that is, the layered structure of the semiconductor layer 26a, semiconductor layer 26b, and wiring layer 26c) is arranged on each of the gate insulating films 24. In this MOSFET, when the gate-on potential is applied to the gate electrodes 26, the MOSFET turns on by the channels being formed in the body region 32 in the vicinity of the upper surface 12a. This MOSFET also has a fast switching speed, since the gate electrodes 26 comprise the heterojunctions 27 at the interfaces of the semiconductor layers 26a (AlGaN) and the semiconductor layers 26b (n-type GaN).

Notably, in the MOSFET of the fourth embodiment, the semiconductor layers 26b may be constituted of the p-type GaN. According to this configuration, similar to the third embodiment, the usable range of the gate potential can be broadened.

Fifth Embodiment

Figure 10:
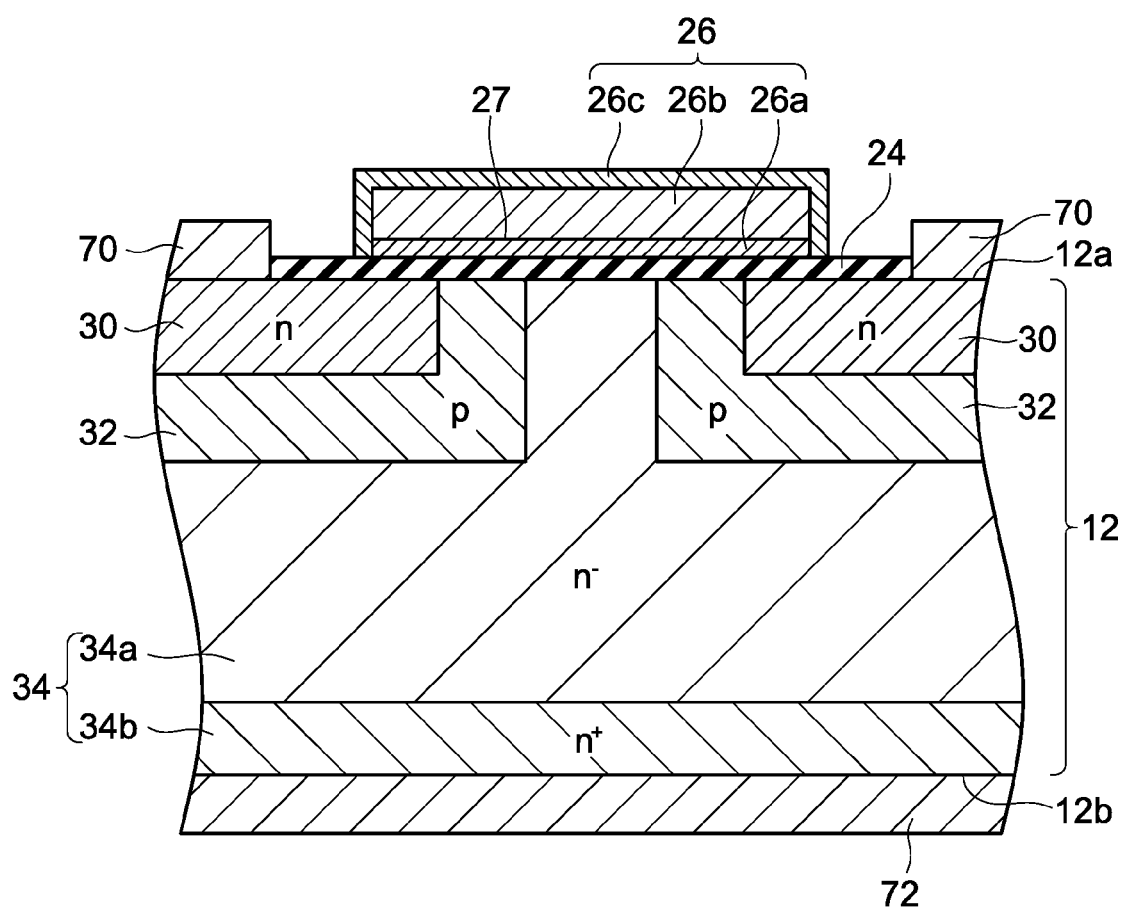
FIG. 10 is a vertical cross sectional view of a MOSFET of a fifth embodiment.

FIG. 10 shows a MOSFET of a fifth embodiment. The MOSFET of the fifth embodiment has a part of each wiring layer 26c extending along side surfaces of the corresponding semiconductor layer 26b and semiconductor layer 26a. Other configurations of the MOSFET of the fifth embodiment are similar to those of the MOSFET of the fourth embodiment. Each wiring layer 26c is in contact with both of its corresponding semiconductor layer 26b and semiconductor layer 26a. Thus, the MOSFET of the fifth embodiment has a broad usable range of the gate potential similar to the MOSFET of the second embodiment.

Notably, in the MOSFETs of the aforementioned first to fifth embodiments, the positions of the semiconductor layers 26a (that is, AlGaN) and the semiconductor layers 26b (that is, GaN) may be switched. According to such a configuration as well, the switching speed of the MOSFET can be improved by generating the 2DEGs or the 2DHGs inside the gate electrodes 26.

Further, in the aforementioned first to fifth embodiments, n-channel type MOSFETs were exemplified as the switching device. However, the aforementioned technique may be adapted to other switching devices such as a p-channel type MOSFET or IGBT.

Hereinbelow, relationships of constituent features of the embodiments and constituent features of the claims will be described. The source regions 30 of the embodiments are an example of a first semiconductor layer of the claims. The body region 32 of the embodiments is an example of a second semiconductor layer of the claims. The drain region 34 of the embodiments is an example of a third semiconductor layer of the claims. The semiconductor layers 26a of the embodiments are an example of a fourth semiconductor layer of the claims. The semiconductor layers 26b of the embodiments are an example of a fifth semiconductor layer of the claims. The wiring layers 26c of the embodiments are an example of a wiring layer of the claims.

Some technical elements disclosed herein are listed below. Notably, each technical element hereinbelow is independently useful.

In a switching device disclosed herein as an example, the first semiconductor layer and the third semiconductor layer may be of an n-type, the second semiconductor layer may be of a p-type, the bandgap of the fifth semiconductor layer may be narrower than the bandgap of the fourth semiconductor layer, the fifth semiconductor layer may be of the type, and the gate electrode may comprise a wiring layer made of a metal and being in contact with the fifth semiconductor layer.

According to this configuration, the potential of the grate electrode can be contr led via the wiring layer.

In a switching device disclosed herein as an example, the wiring layer may be in contact with the fourth semiconductor layer.

According to this configuration, even if the potential of the wiring layer is increased, the two-dimensional gas of carriers will not disappear from the interface between the fourth semiconductor layer and the fifth semiconductor layer. Thus, a usable range of the gate potential is broader.

In a switching device disclosed herein as an example, the first semiconductor layer and the third semiconductor layer may be of an n-type, the second semiconductor layer may be of a p-type, the bandgap of the fifth semiconductor layer may be narrower than the bandgap of the fourth semiconductor layer, the fifth semiconductor layer may be of the p-type, and the gate electrode may comprise a wiring layer made of a metal and being in contact with the fifth semiconductor layer.

According to this configuration, even if the potential of the wiring layer is increased, the two-dimensional gas of carriers will not disappear from the interface between the fourth semiconductor layer and the fifth semiconductor layer. Thus, the usable range of the gate potential is broader.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A switching device comprising:
a first semiconductor layer of a first conductivity type;
a second semiconductor layer of a second conductivity type being in contact with the first semiconductor layer;
a third semiconductor layer of the first conductivity type being in contact with the second semiconductor layer and separated from the first semiconductor layer by the second semiconductor layer;
a gate insulating film covering a surface of the second semiconductor layer in a range in which the second semiconductor layer separates the first semiconductor layer from the third semiconductor layer; and
a gate electrode facing the second semiconductor layer via the gate insulating film,
wherein
the gate electrode comprises:
a fourth semiconductor layer covering a surface of the gate insulating film;
a fifth semiconductor layer having a bandgap different from a bandgap of the fourth semiconductor layer and covering a surface of the fourth semiconductor layer; and
a wiring layer constituted of a metal, the wiring layer being in contact with the fourth semiconductor layer and the fifth semiconductor layer.

2. The switching device of claim 1, wherein
the first semiconductor layer and the third semiconductor layer are of an n-type,
the second semiconductor layer is of a p-type,
the bandgap of the fifth semiconductor layer is narrower than the bandgap of the fourth semiconductor layer,
the fifth semiconductor layer is of the n-type.

3. The switching device of claim 1, wherein
the first semiconductor layer and the third semiconductor layer are of an n-type,
the second semiconductor layer is of a p-type,
the bandgap of the fifth semiconductor layer is narrower than the bandgap of the fourth semiconductor layer, and
the fifth semiconductor layer is of the p-type.

* * * * *

UNITED STATES PATENT AND TRADEMARK OFFICE
CERTIFICATE OF CORRECTION

PATENT NO. : 9,865,723 B2
APPLICATION NO. : 15/403445
DATED : January 9, 2018
INVENTOR(S) : Masahiro Sugimoto et al.

It is certified that error appears in the above-identified patent and that said Letters Patent is hereby corrected as shown below:

In the Specification

In Column 1, Line 32, after "MOSFETs", delete "hut" and insert --but--, therefor.

Signed and Sealed this
Seventeenth Day of April, 2018

Andrei Iancu
*Director of the United States Patent and Trademark Office*